(12) United States Patent
Wang et al.

(10) Patent No.: US 10,289,210 B1
(45) Date of Patent: May 14, 2019

(54) ENABLING TOUCH ON A TACTILE KEYBOARD

(71) Applicant: Apple Inc., Cupertino, CA (US)

(72) Inventors: Paul X. Wang, Cupertino, CA (US); Liquan Tan, Sunnyvale, CA (US); Reza Nasiri Mahalati, Cupertino, CA (US); Alex J. Lehmann, Sunnyvale, CA (US); Aidan N. Zimmerman, Cupertino, CA (US); Ivan S. Maric, San Diego, CA (US)

(73) Assignee: Apple Inc., Cupertino, CA (US)

( * ) Notice: Subject to any disclaimer, the term of this patent is extended or adjusted under 35 U.S.C. 154(b) by 9 days.

(21) Appl. No.: 15/499,477

(22) Filed: Apr. 27, 2017

Related U.S. Application Data

(60) Provisional application No. 62/397,091, filed on Sep. 20, 2016.

(51) Int. Cl.
  *G06F 3/023* (2006.01)
  *G06F 3/02* (2006.01)
  *G06F 3/01* (2006.01)

(52) U.S. Cl.
  CPC ............ *G06F 3/0219* (2013.01); *G06F 3/016* (2013.01); *G06F 3/017* (2013.01); *G06F 3/0234* (2013.01)

(58) Field of Classification Search
  CPC ....... G06F 3/021; G06F 3/03547; G06F 3/041
  See application file for complete search history.

(56) References Cited

U.S. PATENT DOCUMENTS

| | | | |
|---|---|---|---|
| 6,377,685 B1 | 4/2002 | Krishnan | |
| 6,680,677 B1 * | 1/2004 | Tiphane | ................ G06F 3/021 341/22 |
| 7,659,887 B2 * | 2/2010 | Larsen | ................ G06F 3/0213 341/21 |
| 8,754,854 B1 * | 6/2014 | Hamburgen | .......... G06F 3/0489 345/168 |
| 2006/0181511 A1 | 8/2006 | Woolley | |
| 2008/0094373 A1 * | 4/2008 | Song | .................... G06F 1/1624 345/173 |

FOREIGN PATENT DOCUMENTS

CN          105097341          11/2015

\* cited by examiner

*Primary Examiner* — Alexander Eisen
*Assistant Examiner* — Cory A Almeida
(74) *Attorney, Agent, or Firm* — Joseph F. Guihan

(57) ABSTRACT

Disclosed herein is a multi-function input device, such as a keyboard. The multifunction input device has a touch-sensing layer that enables a user to use the multifunction input device as a standard keyboard and also as a touch sensitive surface such as, for example, a trackpad.

20 Claims, 12 Drawing Sheets

US 10,289,210 B1

ENABLING TOUCH ON A TACTILE KEYBOARD

CROSS-REFERENCE TO RELATED APPLICATION(S)

This application is a nonprovisional patent application of and claims the benefit of U.S. Provisional Patent Application No. 62/397,091, filed Sep. 20, 2016 and titled "Enabling Touch on a Tactile Keyboard," the disclosure of which is hereby incorporated herein by reference in its entirety.

FIELD

The described embodiments relate generally to an input device, such as a keyboard for a computing device. More particularly, the present embodiments relate to an input device that enables a user to provide mechanical input and touch input.

BACKGROUND

Some portable computing devices, such as laptop computers, include a standard QWERTY keyboard for providing text input. These portable computing devices may also include a trackpad, a mouse and/or a touch sensitive display that enables the user to provide touch input to the computing device.

Although a variety of input devices may be provided, a user is typically required to move his or her hands from one input device to another in order to provide each type of input. For example, if a user is typing on the keyboard and wishes to select a particular icon on the display or move a cursor, the user's hands must be moved from the keyboard to a mouse, a trackpad or the display. Once the user has completed the desired action with the touch input device and wishes to return to typing, the user's hands are returned to the keyboard.

SUMMARY

Described herein is a multifunction input device that provides both mechanical and touch-sensing input in a single structure (such as a key stack) for operation with an electronic device. In some embodiments, the multifunction input device may be a touch-sensitive keyboard. The keyboard may include an enclosure and an array of keys positioned at least partially within the enclosure. Each of the array of keys may be formed from a key stack; the key stack may include a keycap, a base plate, a support mechanism operably connected to the keycap and the base plate and configured to move the keycap vertically, a touch-sensing layer attached to the keycap, and an electrical connection operably connected to the touch-sensing layer and a touch-sensing layer within an adjacent key.

Another embodiment may be a touch input device, including a first movable input component comprising a touch-sensing layer, a second movable input component comprising a touch-sensing layer, and a flexible electrical connection spanning between the first movable input component and the second movable input component.

Still another embodiment may be an input device comprising an array of keys. The input device may include a keycap associated with a key, a support mechanism operably connected to the first keycap and configured to move the keycap vertically, an array of force-sensitive structures attached to a top surface of the keycap, and a touch-sensing layer positioned above the array of force-sensitive structures.

BRIEF DESCRIPTION OF THE DRAWINGS

The disclosure will be readily understood by the following detailed description in conjunction with the accompanying drawings, wherein like reference numerals designate like structural elements.

Figure 1A:
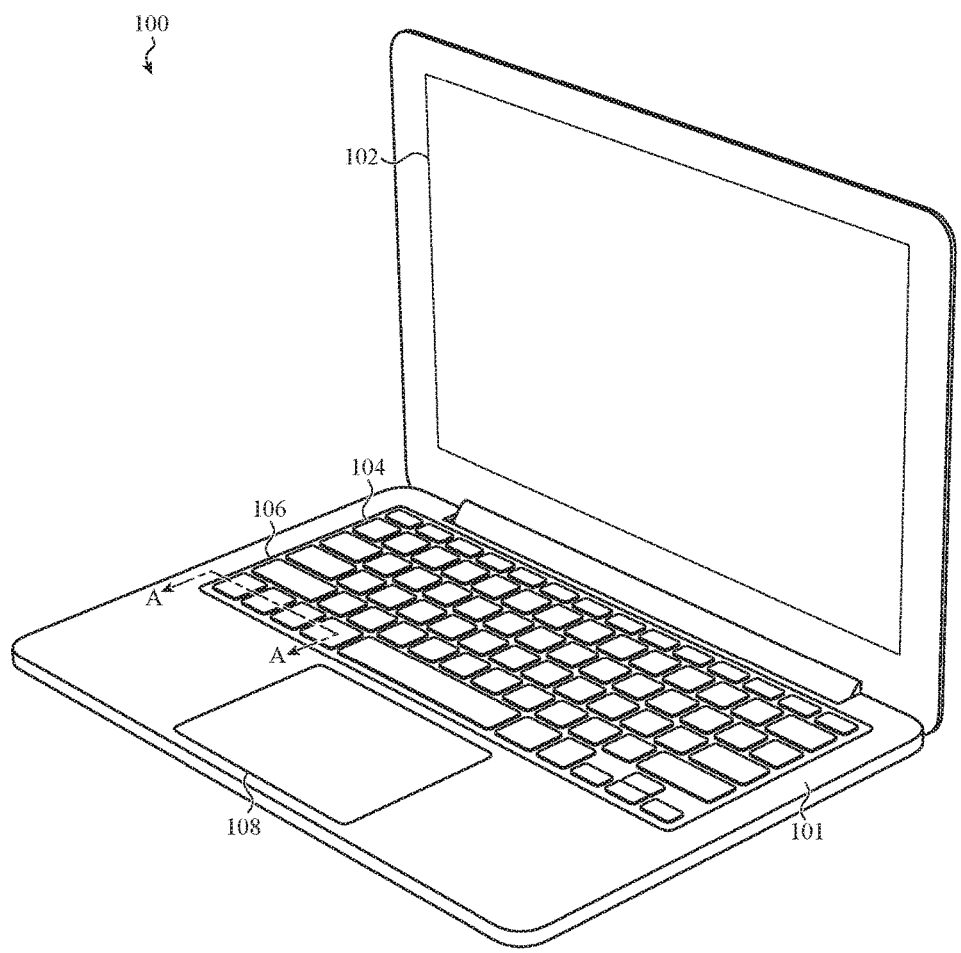
FIG. 1A depicts an example computing device that may use or otherwise incorporate the multifunction input device of the present disclosure.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, they are intended to cover alternatives, modifications, and equivalents as can be included within the spirit and scope of the described embodiments as defined by the appended claims.

The embodiments described herein are directed to a multifunction input device that utilizes movable input components to receive both mechanical input and touch input, and use both to generate one or more input signals to an electronic device. In some embodiments, the multifunction input device is a keyboard. The keyboard may be integrated with the computing device or it may be removably coupled to the computing device.

The multifunction input device may utilize, or otherwise enable a user to provide, mechanical input and touch input to the computing device, either simultaneously or at separate times. For example, the multifunction input device may have a number of keys or buttons that may be actuated by a user. In addition, the multifunction input device may enable a user to provide touch input to the keys or buttons in order to move a cursor, select a displayed icon, perform a gesture, and so on.

The multifunction input device may have a touch-sensing layer (or other touch-sensing input mechanism) disposed near the top of each of the buttons, keys, or other input surfaces, and a collapsible dome switch (or other mechanical input mechanism) beneath the touch-sensing layer and/or input surface. As such, the entire surface of the input device (or designated portions of the surface of the input device) may function together as a touch-sensitive input device. Thus, when a user wishes to move a cursor, select an icon or perform an action associated with a gesture, the user can provide the input directly to or along the surface of the keys (or buttons of the input device, or the like) without removing his or her fingers or hands from the keys. Thus, single gestures or inputs may be provided across multiple key surfaces.

The touch-sensing input mechanism or layer may be attached to the top of each keycap (or button), with the keys interconnected through flexible electrical connectors or other deformable electrical connections. These tendrils may take the form of electrical conductors (e.g., flexible printed circuit boards) spanning between the keys, extending from the touch-sensitive layers, and so on. The touch-sensing layer may capacitively sense a user's finger, a stylus, or the like, and may include various drive and sense electrodes arranged in a particular pattern. The touch-sensing layer may sense a touch even if the key(s) is not depressed. Likewise, a near touch (one example of which is a finger hovering above a key) may be sensed.

Further, the input mechanism may incorporate a collapsible dome switch or other mechanical input mechanism to provide a second type of input. When the input surface (e.g., keycap, button, or the like) is depressed with sufficient force, the mechanical input mechanism may collapse, deform, or the like. The input mechanism may move accordingly, and the deformation of the mechanical input mechanism may complete a circuit to generate an electrical signal. Thus, the single input mechanism may provide two different inputs and incorporate two different input mechanisms.

In one embodiment, the touch-sensing layer, or other touch-sensing input mechanism, includes at least two sense electrodes electrically connected in pairs. One or more drive electrodes are positioned between the pairs of sense electrodes. The sense electrodes and the drive electrodes may have various dimensions and be arranged in various ways and patterns.

For example, the sense electrodes may be arranged in rows while the drive electrodes are arranged in columns. In another arrangement, the sense electrodes may be arranged in columns while the drive electrodes are arranged in rows. In yet another embodiment, portions of the drive electrodes may be interlocked with portions of the sense electrodes to form an interdigitated pattern. In another example, the sense electrodes may be arranged in a first plane and the drive electrodes may be arranged on a second, different plane. In some embodiments, the dimensions of the drive and sense electrodes may vary. For example, the dimensions of the drive electrodes and/or the sense electrodes may have a first set of dimensions on a first portion of a keycap and may have a second set of dimensions at a second portion of the keycap.

In some embodiments, the multifunction input device may include an insulating layer, such as a fabric layer positioned over each of the keys and the touch-sensing layer. The fabric layer may be smooth to the touch and may also soften sharp edges of a keycap that a user contacts while moving a hand or finger across the surfaces of the keys (for example, when providing touch input). The fabric layer may also protect the flexible electrical connectors spanning between keys. The fabric layer may include embossed portions that correspond to each key of the input device. The embossed portions may be adhered to each keycap.

These and other embodiments are discussed below with reference to FIGS. 1-10. However, those skilled in the art will readily appreciate that the detailed description given herein with respect to these Figures is for explanatory purposes only and should not be construed as limiting.

Figure 1B:
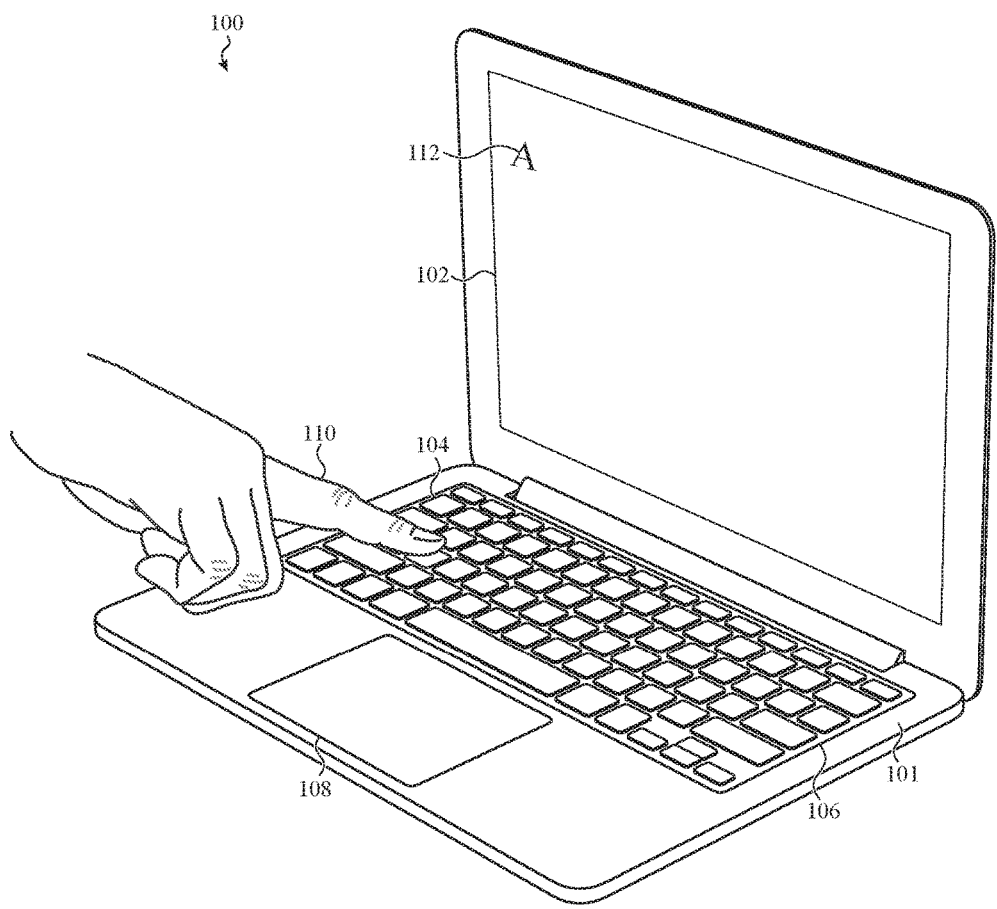
FIG. 1B depicts a user interacting with the example computing device of FIG. 1A.
Figure 1C:
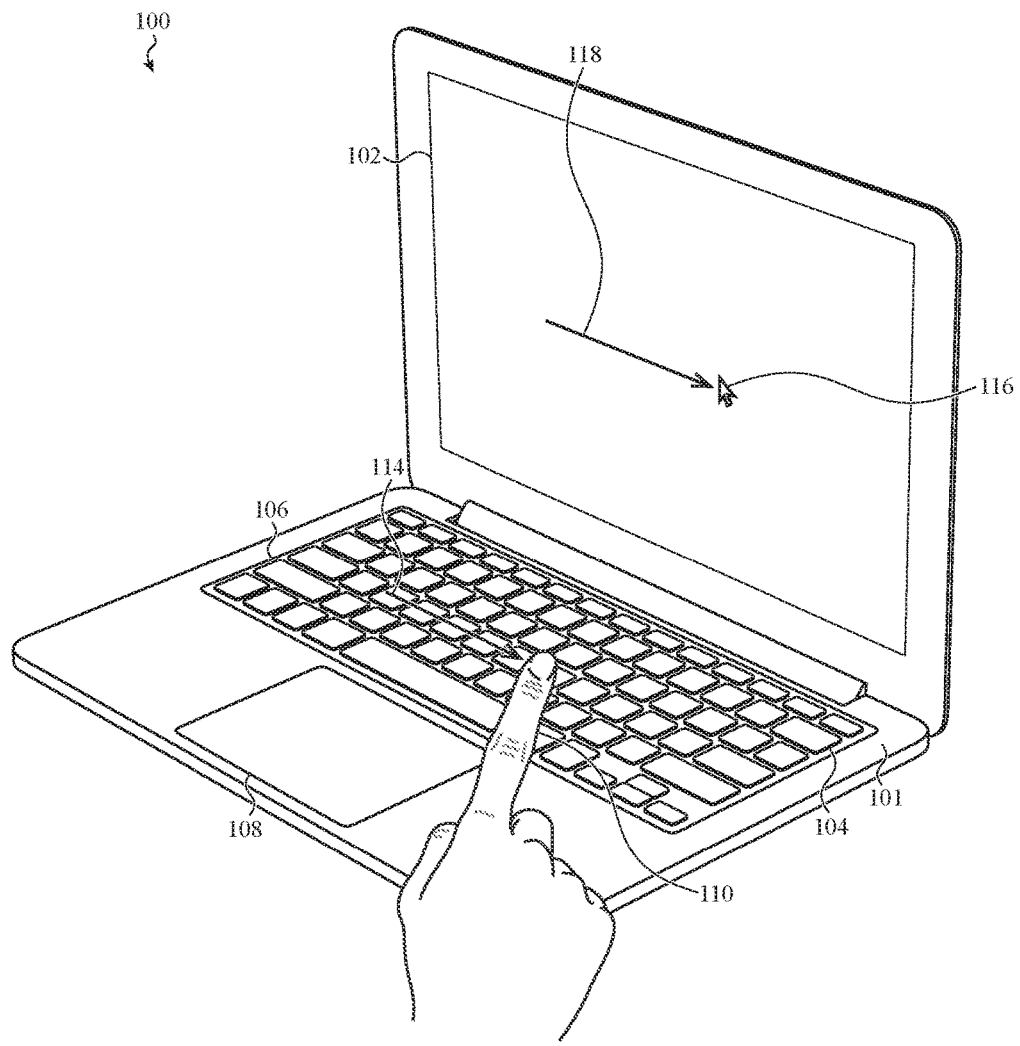
FIG. 1C depicts a user providing a gestural input across a set of keys, utilizing the example computing device of FIG. 1A.

FIGS. 1A-1C depict an example computing device 100 that may use or otherwise incorporate the multifunction input device of the present disclosure. In some embodiments, as depicted in FIG. 1A, the multifunction input device is a keyboard and the computing device 100 is a laptop computer. Although a keyboard is specifically mentioned, the embodiments described herein may be incorporated by various input devices or mechanisms such as, for example, trackpads, mice, buttons, and so on.

In one implementation, the keyboard may be integrated with the computing device 100. In another embodiment, the keyboard may be removably attached to a computing device. For example, the keyboard may be configured to be removably attached to a tablet computing device, a mobile phone, a personal digital assistant, or another portable computing device. An example of a removably attached keyboard is illustrated below with respect to FIG. 8. In another embodiment, the keyboard may not be attached to a computing device and may only be operably connected to the computing device. An example desktop computer and separate keyboard are illustrated below with respect to FIG. 9.

The computing device 100 may include an enclosure 101 housing a keyboard and a display 102. The display 102 may function as both an input device and an output device. For example, the display 102 may output images, graphics, text, and the like to a user. The display 102 may also act as a touch input device that detects and measures a location of a touch input on the display 102, via touch-sensing circuitry. The computing device 100 may also include one or more force sensors that detect and/or measure an amount of force exerted on the display 102.

The keyboard of the computing device 100 includes an array of keys 104 or buttons (e.g., movable input components). Each of the array of keys 104 may correspond to a particular input. The keyboard may also include a frame 106 or key web. The frame 106 may define an aperture through which each key 104 protrudes, such that each of the array of keys 104 is at least partially positioned within the frame 106 and at least partially without the frame. The frame 106 may be made of various materials such as, but not limited to, aluminum, plastic, metal, rubber, and the like, and may be used to provide structural support for the keyboard and/or each individual key 104. The frame 106 also separates one key 104 from an adjacent key 104 and/or a housing of the computing device 100. Although not shown in FIG. 1A, the keyboard may also include a fabric layer that is placed over each of the keys 104.

In some embodiments, the computing device 100 may also include an input component 108. The input component 108 may be a touch input device such as a trackpad. In some implementations, the input component 108 may be omitted from the computing device 100 as the keyboard may function as a touch input device and a keyboard.

For example, and as shown in FIG. 1B, an input mechanism 110, such as a user's finger, may actuate one of the keys 104 to cause the computing device 100 to produce an output 112 on the display 102. In some embodiments, the key 104 may be a mechanical key having a switch, a contact, or other such mechanism that provides a signal when the key 104 is actuated. In other embodiments, actuation of the key 104 may be detected by one or more capacitive sensors.

In addition, the keyboard may act as a multi-touch input device. The multi-touch input device may include a touch-sensing layer, and appropriate touch-sensing circuitry, that can detect a location of a touch input, and may detect multiple touch inputs in more than one area concurrently. When a touch is determined, the computing device 100 performs a certain action. For example, and turning to FIG. 1C, the user may move an input mechanism 110, such as a finger, across one or more keys 104 of the keyboard and one or more portions of the frame 106 in the direction of arrow 114. In response, a pointer 116 or other icon that is output on the display 102 may move in the direction of arrow 118. In some embodiments, the keys 104 are not actuated (although they may be actuated) as the user moves a finger across the surface of each key 104 and across the fabric spanning between the keys 104.

The touch-sensing layer may operate in accordance with a number of different touch sensing schemes. In some implementations, the touch-sensing layer may operate in accordance with a mutual-capacitance sensing scheme. Under this scheme, the touch-sensing layer may include two layers of intersecting conductive traces that are configured to detect the location of a touch by monitoring a change in capacitive or charge coupling between pairs of intersecting traces. In another implementation, the touch-sensing layer may operate in accordance with a self-capacitive sensing scheme. Under this scheme, the touch-sensing layer may include an array of capacitive electrodes or pads that are configured to detect the location of a touch by monitoring a change in self-capacitance of a small field generated by each electrode. In other implementations, a resistive, inductive, or other sensing scheme could also be used.

For example, under a mutual-capacitance sensing scheme the touch-sensing layer detects a change in capacitance at a given area and provides the detected change to a processing unit of the computing device 100. The processing unit then determines the appropriate action to take based on the detected change in capacitance. For example, the processing unit may determine that the change in capacitance across various regions of the keyboard are equivalent to a scroll operation. In another embodiment, the detected change in capacitance may be equivalent to a gesture, a swipe, or other types of input. Although the keyboard acts as a multi-touch input device, similar functionality may be provided by the input component 108.

In some embodiments, the touch-sensing layer may detect the placement of a user's hands and/or fingers on the keyboard. If placement is incorrect (e.g., the fingers are not properly placed on the home row of the keyboard) the computing device may notify the user of the incorrect placement. In some embodiments, the notification may be a haptic output that is provided by a haptic actuator associated with electronic device 100.

Figure 2:
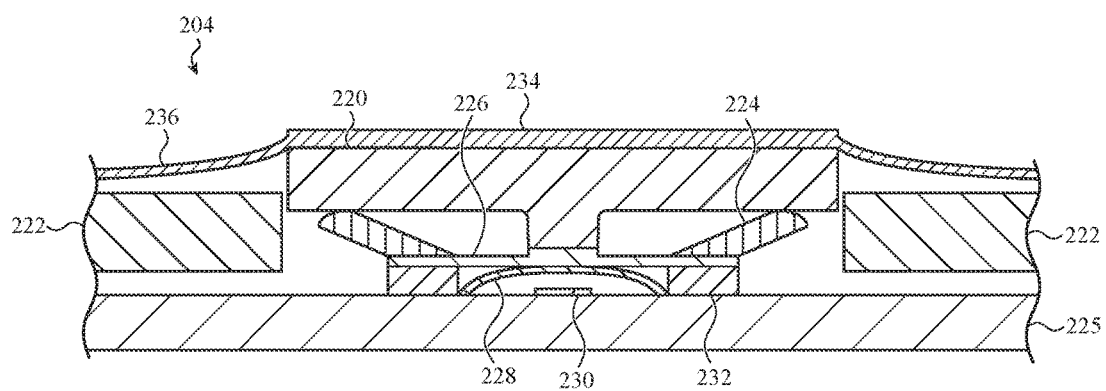
FIG. 2 depicts a cross-sectional view of a key of a multifunction input device, taken along line A-A of FIG. 1A and according to a first embodiment.

Turning in more detail to the operation of a key 204, FIG. 2 depicts a cross-sectional view of a key 204 or a button of a multifunction input device taken along line A-A of FIG. 1A according to a first embodiment. The key 204 includes a keycap 220 that is at least partially surrounded by a frame 222 or key web. In some instances, the frame 222 defines an aperture though which the keycap 220 protrudes or is placed.

The keycap 220 may be coupled to a restoring mechanism 224 (which may also be a support mechanism) that enables the keycap 220 to move from a first position to a second position within the frame 222 when actuated. The restoring mechanism 224 may be a scissor mechanism, a butterfly mechanism, a hinge mechanism, a spring mechanism, and the like that restores the keycap 220 to its nominal position when the keycap 220 is released or no longer actuated.

The key 204 may also include a membrane 226 positioned over a collapsible dome mechanism 228 (or other suitable mechanical input mechanism, as described below) and a contact 230. In some embodiments, the membrane 226 is coupled to a contact housing 232 that contains the collapsible dome mechanism 228 and the contact 230. In operation, the membrane 226 acts as a seal to prevent contaminants from interfering with the electrical and/or mechanical operation of the collapsible dome mechanism 228 and/or the contact 230. In some embodiments, the membrane 226 may be made of rubber, plastic, or other such materials. Each of the collapsible dome mechanism 228, the contact 230, and the contact housing 232 may be positioned over a base plate 225.

In some embodiments, the base plate 225 may be a printed circuit board or the like. In other embodiments, the base plate 225 may be a generally rigid substrate configured to accept an input force transmitted through the touch-sensing layer 234 (described below), the keycap 220, the membrane 226, and the collapsible dome mechanism 228. The base plate 225 may be an internal support, as one example. As another example, the base plate 225 may be a portion of an enclosure, such as a bottom surface of an enclosure.

The contact housing 232 may secure or otherwise contain the collapsible dome mechanism 228 during actuation of the keycap 220. For example, when the keycap 220 is actuated, the collapsible dome mechanism 228 is deformed, collapses, or is otherwise compressed so that it touches or otherwise connects to the contact 230. The dome's collapse completes an electrical circuit, thereby indicating the key 204 has been actuated and generating an electrical input signal. In various embodiments, the collapsible dome mechanism 228 may be a metal dome, a rubber dome, a plastic dome, or it may be made from suitable other materials. Further, it should be appreciated that the membrane 226 and/or contact housing 232 may be omitted in certain embodiments.

Other support mechanisms may be used in the place of the collapsible dome mechanism 228 and/or the membrane 226. For example, the keycap 220 may be coupled to a mechanical switch mechanism, a buckling-spring mechanism, or another suitable support mechanism; such support mechanisms are typically beneath the keycap and physically abutting the keycap.

A scissor-style support mechanism may be used in some embodiments, while in others a V-shaped or U-shaped support mechanism may be used. Generally, the support mechanism (whether a dome, scissor, V-shape, spring, or other type) biases the keycap 220 upward in the absence of any force exerted thereon, and returns the keycap 220 to its resting position when force is removed from the keycap. In certain embodiments, the collapsible dome 228 may be present but may not act as a support mechanism; rather, a separate support mechanism may operate as described herein to bias and support the keycap 220. In some embodiments, the support mechanism may also function as the restoring mechanism, while in other embodiments the two may be separate structures.

In the place of a membrane 226 and/or contact 230 may be a mechanical switch, a capacitive sensor, a Hall Effect sensor, a resistive sensor, an optical sensor, or a similar sensor suitable for registering the vertical motion of the keycap 220 when pressed downward.

The key 204 also includes a touch-sensing layer 234. The touch-sensing layer 234 may be integrated with or positioned on or near the keycap 220. As will be described below, the touch-sensing layer 234 may be comprised of various sense electrodes and drive electrodes arranged in a particular pattern. The sense electrodes and drive electrodes are configured to detect a change in capacitance therebetween (in a given region or area of the multifunction input device and/or over a particular key 204) when an input mechanism, such as a user's finger, contacts the keycap 220 as it moves over the surface. The change in capacitance between a sense and drive electrode(s), or at a sense electrode, may initiate an input to an associated electronic device. Accordingly, when a user touches a key but does not exert sufficient force to collapse the associated dome, the touch may nonetheless be registered as an input and a corresponding electrical signal generated. Thus, a single key may provide two different inputs based on two different actions from a user, namely touch and force. Further, the inputs may be generated in response to an electrical phenomenon (e.g., a change in capacitance) and a mechanical phenomenon (e.g., the collapse of a dome or other physical closing of a switch, or travel of a key) associated with a single key.

Likewise, as a user's finger (or a stylus, or other suitable object) moves from the exterior surface of one key to another, the changes in capacitance at each successive key may be registered and used as input. The motion of the finger or other object may thus be tracked. In this fashion, multiple touch-sensitive keys may be used together to provide a single input, such as a gesture, to an associated electronic device.

The touch-sensing layer 234 may be formed on or within a flexible substrate (e.g., a flexible printed circuit board or similar substrate). The flexible substrate may be formed from a suitable material, such as polyimide or polyethylene terephthalate. The flexible substrate may be bonded to the keycap, for example using an adhesive layer such as a pressure sensitive adhesive.

Because the array of keys 204 on a keyboard may not form a continuous surface, flexible electrical connectors 236, optionally including a conductive element (e.g., an electrical connection), may connect each key 204 to one or more adjacent keys 204. The flexible electrical connectors 236 may be at least partially formed from the same material as the touch-sensing layer 234, or may be formed from distinct materials. For example, the flexible electrical connectors 236 may be formed from the same material as the flexible substrate of the touch-sensing layer 234.

In some cases, the touch-sensing layer 234 is formed as a flexible printed circuit board. The touch-sensing layer 234 may be a multi-layer flexible printed circuit board, such as depicted further with respect to FIGS. 4A and 4B below. In these cases, a flexible electrical connector 236 may also be formed as a flexible printed circuit board. In some embodiments the flexible electrical connectors 236 are formed as part of the same flexible printed circuit board as the touch-sensing layer 234, while in other embodiments the flexible electrical connectors 236 are formed separately and coupled to the touch-sensing layer 234 (see FIGS. 5A-5C).

In some embodiments, the flexible electrical connectors 236 may extend from a side of one touch-sensing layer to another, as opposed to extending from a corner. The flexible electrical connector 236 may extend at a non-right angle, such that the length of the flexible electrical connector is greater than the distance between two adjacent keys (or two adjacent touch-sensing layers of two adjacent keys). The flexible electrical connector may thus be long enough that it does not transmit force between keys when one key is pressed.

Figure 3:
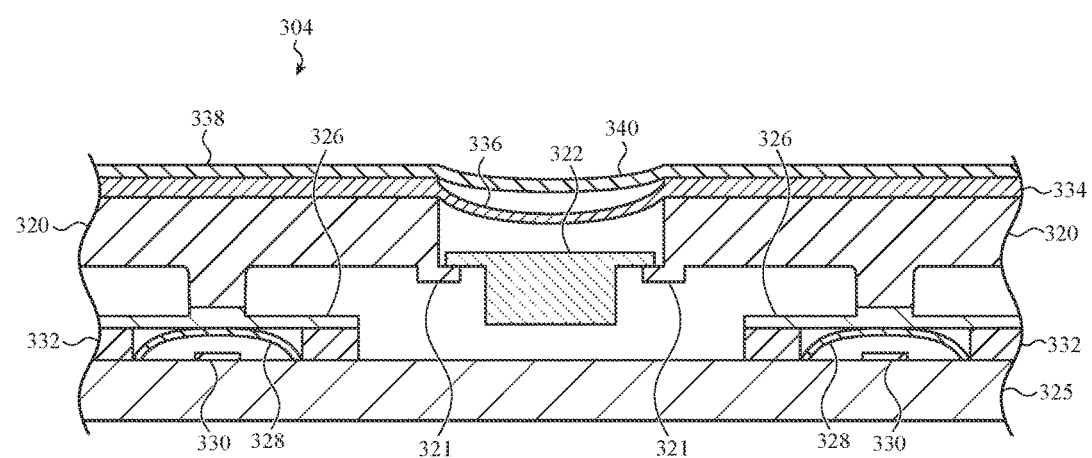
FIG. 3 depicts a cross-sectional view of two keys of a multifunction input device, taken along line A-A of FIG. 1A and according to another embodiment.

FIG. 3 depicts a cross-sectional view of two keys 304 of a multifunction input device taken along line A-A of FIG. 1A according to another embodiment. The keys 304 include a keycap 320 positioned within an aperture defined by the frame 322. In this embodiment, the keycap 320 may include a flange 321 that interacts with or otherwise contacts a portion of the frame 322 when the key 304 is in its nominal position. In this particular embodiment, the key 304 includes an insulating layer, such as a fabric layer 338 that is positioned over the keycap 320. The fabric layer 338 may be bonded or otherwise coupled to the touch-sensing layer 334 and/or keycap 320 by an adhesive. The fabric layer 338 may be formed from any appropriate material, such as silicone, polyester, nitrile, or a similar material or combination of materials.

In some embodiments, the portion of the fabric layer 338 that is positioned above the keycap 320 includes a raised or an embossed portion. The embossed portion may have a surface area that is larger than a surface area of the keycap 320 and/or the touch-sensing layer 334. The embossed portion may be defined by or otherwise include a transition region 340 that extends between an outer edge of the keycaps 320.

The transition region 340 provides a smooth transition between each key 304 of the keyboard. For example, in typical keyboards, a space is present between each key 304. As a user slides a finger over the keys, the user's finger contacts the rigid edges of each key. Continuous contact with these rigid edges may be uncomfortable for the user.

However, the transition region 340 provides a transition point between the edges of the keycaps 320 which reduces or eliminates the rigid transitions that may otherwise be present between the keys 304. The transition region 340 may further protect the flexible electrical connectors 336 (or other electrical connection) spanning between the touch-sensing layers 334 on each keycap 320. In some embodiments, the transition region 340 may be bonded with, or otherwise affixed to, the flexible electrical connectors 336. In other embodiments, the fabric layer 338 may not be coupled to the flexible electrical connectors 336. In some embodiments, and as shown in FIG. 3, the flexible electrical connector 336 is spaced apart from the insulating layer 338 forming the transition region 340, thereby ensuring that the flexible electrical connector 336 and transition region 340 may deform separately without pulling or otherwise exerting force on one another. This may help ensure that pressing a first key 304 does not inadvertently translate or otherwise move an adjacent key 304 connected by the flexible electrical connector.

The flexible electrical connectors 336, or other electrical connections, are generally sufficiently pliable and dimensioned to permit the adjacent keys 304 connected by the connectors 336 to move independently of one another. That is, pressing down on one key 304 will not move another key connected thereto by the flexible electrical connector 336. Rather, the electrical connector 336 will deform while maintaining the physical connection between the pressed key 304 and adjacent key 304.

In some instances, the fabric layer 338 and/or the flexible electrical connectors 336 may act as a restoring mechanism that returns the keycap 320 to its nominal position once the key 304 has been actuated. As such, a restoring mechanism, such as, for example, a scissor mechanism or a butterfly mechanism, may be omitted. In other embodiments the key 304 may also include a scissor, butterfly, or other restoring mechanism such as shown above with respect to FIG. 2.

The key 304 may also include membrane 326, a collapsible dome mechanism 328 (and/or other suitable support mechanism to bias the keycap 320) and a contact 330. The membrane 326 may be coupled to a contact housing 332. Each of the dome mechanisms 328, the contact 330, and the contact housing 332 may be positioned over a base plate 325. Each of these components may function in a similar manner to the similar components described above. The base plate 325 likewise may be any of the aforementioned structures. In some embodiments, the membrane 326 and contact housing 332 may cooperate to form a support mechanism to bias the keycap upward in the absence of an exerted force, while in other embodiments the collapsible dome mechanism may be such a support mechanism.

The key 304 may also include a touch-sensing layer 334 (or other suitable touch-sensing input mechanism) disposed above the keycap 320. As described above, the touch-sensing layer 334 may detect a change in capacitance as a user moves a finger over the surface of the keycap 320 and the fabric layer 338.

Figure 4A:
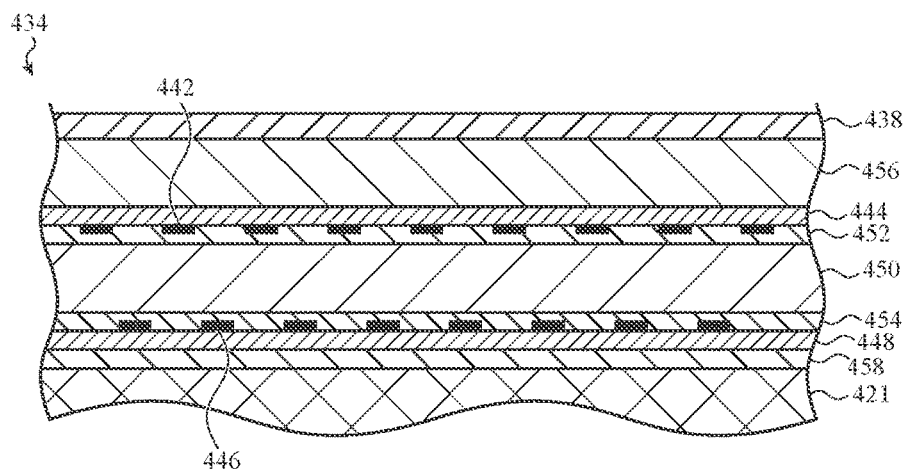
FIG. 4A depicts a cross-sectional view of an example touch-sensing layer.
Figure 4B:
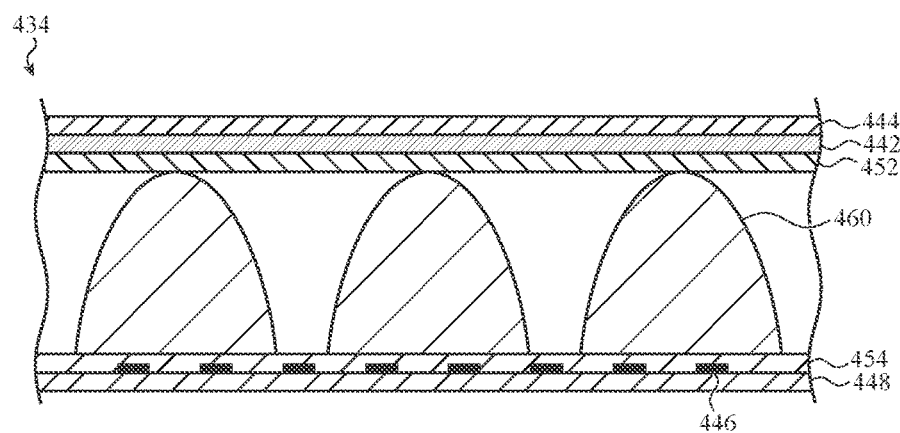
FIG. 4B depicts a cross-sectional view of another example touch-sensing layer.

The touch-sensing layer 434 may be comprised of multiple further layers as shown in FIGS. 4A and 4B. FIG. 4A depicts a cross-sectional view of the touch-sensing layer 434 according to a first embodiment. The touch-sensing layer 434 may include an array of sense electrodes 442 positioned near a top surface of the touch-sensing layer 434. The sense electrodes 442 may include materials such as, but not limited to: silver, copper, gold, constantan, karma, isoelastic, indium tin oxide, or any combination thereof. The sense electrodes 442 may be disposed on a first substrate layer 444. The first substrate layer 444 may be comprised of a number of suitable materials, such as, but not limited to: polyimide, polyethylene terephthalate, plastic, metal, ceramic, glass, or any combination thereof.

The sense electrodes 442 may be formed or deposited on the first substrate layer 444 using a suitable disposition technique such as, but not limited to: vapor deposition, sputtering, printing, roll-to-roll processing, gravure, pick and place, adhesive, mask-and-etch, and so on. If the keyboard includes transparent elements, it may be preferable for the sense electrodes 442 and first substrate layer 444 to be made from optically transparent materials, while optically opaque materials may be acceptable or preferable if the keyboard is opaque.

An array of drive electrodes 446 may be positioned on a layer below the sense electrodes 442. Similar to the sense electrodes 442, the drive electrodes 446 may include materials such as, but not limited to: silver, copper, gold, constantan, karma, isoelastic, indium tin oxide, or any combination thereof. The drive electrodes 446 may be comprised of the same material as the sense electrodes 442, or they may be comprised of distinct materials. The drive electrodes 446 may be disposed on a second substrate layer 448. The second substrate layer 448 may be comprised of a number of suitable materials (e.g., the same or a different material as the first substrate layer 444), such as, but not limited to: polyimide, polyethylene terephthalate, plastic, metal, ceramic, glass, or any combination thereof.

The drive electrodes 446 may be formed or deposited on the second substrate layer 448 using a suitable deposition technique (e.g., the same or a different technique as the sense electrodes 442) such as, but not limited to: vapor deposition, sputtering, printing, roll-to-roll processing, gravure, pick and place, adhesive, mask-and-etch, and so on. If the keyboard includes transparent elements, it may be preferable for the drive electrodes 446 and second substrate layer 448 to be made from optically transparent materials, while optically opaque materials may be acceptable or preferable if the keyboard is opaque.

The sense electrodes 442 and the drive electrodes 446 may be separated by an insulating layer 450. The insulating layer 450 may include materials such as, but not limited to: plastic, metal, ceramic, glass, polyimide, polyethylene terephthalate, or any combination thereof. The sense electrodes 442 and first substrate layer 444 may be bonded to the insulating layer 450 with an adhesive layer 452. The adhesive layer 452 may be any suitable material that promotes adhesion between the sense electrodes 442, the first substrate layer 444, and the insulating layer 450. According to some embodiments, the adhesive layer 452 can include a pressure sensitive adhesive.

The drive electrodes 446 and second substrate layer 448 may be similarly bonded to the insulating layer 450 with an adhesive layer 454. The adhesive layer 454 may be any suitable material that promotes adhesion between the drive electrodes 446, the second substrate layer 448, and the insulating layer 450. According to some embodiments, the adhesive layer 454 can include a pressure sensitive adhesive (e.g., the same or a different pressure sensitive adhesive used in adhesive layer 452).

The touch-sensing layer 434 may operate through capacitive sensing, and the sense electrodes 442 and drive electrodes 446 may have various dimensions and be arranged in various ways and patterns. For example, as depicted in FIG. 4A, the touch-sensing layer 434 includes at least two sense electrodes 442 electrically connected in pairs. One or more drive electrodes 446 are positioned in between the pairs of sense electrodes 442.

Additionally or alternatively, the sense electrodes 442 may be arranged in rows while the drive electrodes 446 are arranged in columns. In another arrangement, the sense electrodes 442 may be arranged in columns while the drive electrodes 446 are arranged in rows. In yet another embodiment, portions of the drive electrodes 446 may be interlocked with portions of the sense electrodes 442 to form an interdigitated pattern. In another example, the sense electrodes 442 may be arranged in a first plane and the drive electrodes 446 may be arranged on a second, different plane. In some embodiments, the dimensions of the drive electrodes 446 and sense electrodes 442 may vary. For example, the dimensions of the drive electrodes 446 and/or the sense electrodes 442 may have a first set of dimensions on a first portion of a keycap and may have a second set of dimensions on a second portion of the keycap.

In certain embodiments, the drive electrodes 446 may be omitted and/or replaced with one or more electrical grounds. In such embodiments, capacitances at the sense electrodes 442 may vary as a finger or other object approaches and/or touches the sense electrode(s) 442. This change in capacitance may be measured and used as input, in a fashion similar to the change in capacitance between sense electrodes 442 and drive electrodes 446.

The first substrate layer 444 may further be bonded to additional layers of a key, such as a fabric layer 448 or other external, covering material. The first substrate layer 444 may be bonded to the fabric layer 448 using an adhesive layer 456. The adhesive layer 456 may be any suitable material that promotes adhesion between the first substrate layer 444 and the fabric layer 438. The adhesive layer 456 may include a pressure sensitive adhesive, which may be the same pressure sensitive adhesive used in other adhesive layers or may be different. The second substrate layer 448 may similarly be bonded to additional layers, such as a stiffener layer 421, keycap, or other rigid substrate, and may be bonded with an adhesive layer 458 which may be the same or different from other adhesive layers.

The layers, their arrangements, and the materials described in FIG. 4A are examples. Additional or fewer layers may be implemented in other embodiments. The arrangement of the various layers and the materials used may also differ in other embodiments.

FIG. 4B depicts a cross-sectional view of the touch-sensing layer 434 according to another embodiment incorporating force sensing features. The touch-sensing layer 434 may include an array of sense electrodes 442 positioned near a top surface of the touch-sensing layer 434. The sense electrodes 442 may be disposed on a first substrate layer 444 using suitable techniques, such as those described above with respect to FIG. 4A. The sense electrodes 442 and the first substrate layer 444 may be comprised of a number of suitable materials, such as described above with respect to FIG. 4A.

An array of drive electrodes 446 may be positioned on a second substrate layer 448 below the sense electrodes 442. Similar to the sense electrodes 442, the drive electrodes 446 and second substrate layer 448 may include materials such as those described above with respect to FIG. 4A.

The touch-sensing layer may operate through a capacitive sensing scheme, and the sense electrodes 442 and drive electrodes 446 may have various dimensions and be arranged in various ways and patterns. For example, as depicted in FIG. 4B, the sense electrodes 442 may be arranged in rows while the drive electrodes 446 are arranged in columns. Other arrangements are discussed above with respect to FIG. 4A.

The sense electrodes 442 and the drive electrodes 446 may be separated by a layer of compliant elements 460. The compliant elements 460 may operate to allow for the sense electrodes 442 and drive electrodes 446 to provide for force detection in addition to touch detection. When the user applies force to a surface of the key, the sense electrodes 442 and first substrate layer 444 may be caused to deform and press downward, compressing the one or more compliant elements 460. The sense electrodes 442 may thus be allowed to deflect toward the drive electrodes 446.

When the distance between the sense electrodes 442 and drive electrodes 446 is reduced, there may be a measurable change in an electrical attribute, such as a capacitance, between the electrodes. This allows circuitry connected to the sense electrodes 442 and drive electrodes 446 to determine an amount of applied force, a location of applied force, and a location of touch.

The compliant elements 460 may be comprised of a suitable material, such as a flexible silicone gel. In some embodiments, the compliant elements 460 may be comprised of a compliant foam or an air gap. The compliant elements 460 may be formed in dots, as depicted in FIG. 4B, may be formed in other shapes, or may be formed in a continuous layer. The compliant elements 460 may be surrounded by another material, or may be surrounded by air or a vacuum.

The sense electrodes 442 and first substrate layer 444 may be bonded to the compliant elements 460 with an adhesive layer 452. The adhesive layer 452 may be any suitable material that promotes adhesion between the sense electrodes 442, the first substrate layer 444, and the compliant elements 460. According to some embodiments, the adhesive layer 452 can include a pressure sensitive adhesive.

The drive electrodes 446 and second substrate layer 448 may be similarly bonded to the compliant elements 460 with an adhesive layer 454. The adhesive layer 454 may be any suitable material that promotes adhesion between the drive electrodes 446, the second substrate layer 448, and the compliant elements 460. According to some embodiments, the adhesive layer 454 can include a pressure sensitive adhesive (e.g., the same or a different pressure sensitive adhesive used in adhesive layer 452).

The touch-sensing layer 434 may be further bonded to other materials forming a key, such as a fabric layer and/or a keycap. The layers, their arrangements, and the materials described in FIG. 4B are examples. Additional or fewer layers may be implemented in other embodiments. The arrangement of the various layers and the materials used may also differ in other embodiments.

For example, in some embodiments, the compliant elements 460 are not encapsulated within the touch sensing layer 434. The touch sensing layer 434 may be formed as a flexible printed circuit board positioned over the compliant elements 460, including one or more layers of electrodes 442. The compliant elements 460 may be formed on or coupled to a surface of a separate substrate below the compliant elements 460. The substrate on which the compliant elements are formed or coupled may be another flexible printed circuit board, which may include electrodes 446 for force and/or touch sensing, which may operate as described above.

Figure 5A:
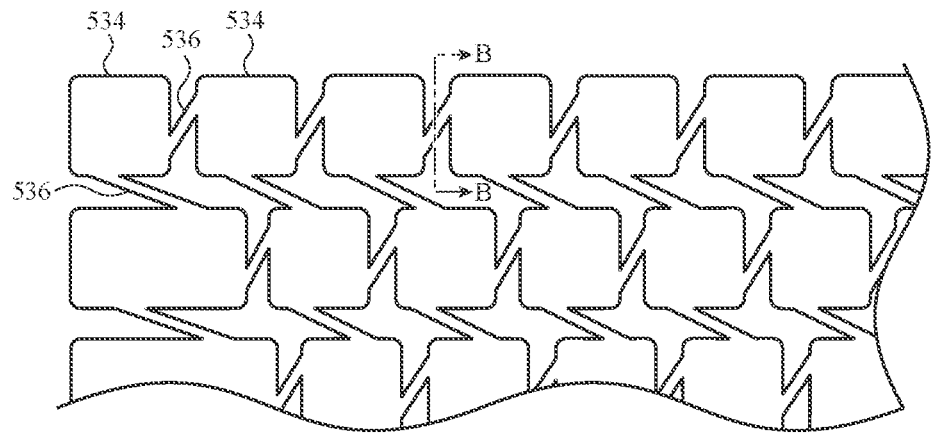
FIG. 5A depicts an array of touch-sensing layers interconnected by flexible electrical connectors.

Embodiments of the present invention may implement the touch-sensing layer 534 on an array of keys, with flexible electrical connectors 536 spanning between the keys, as illustrated in FIG. 5A. FIG. 5A depicts an array of touch-sensing layers 534 interconnected by flexible electrical connectors 536. Each touch-sensing layer 534 is configured to be attached to a keycap, with the flexible electrical connectors 536 spanning between the keycaps, as illustrated above with respect to FIGS. 2 and 3. The touch-sensing layers 534 and flexible electrical connectors 536 may be covered with an insulating layer, such as a fabric layer, as illustrated above with respect to FIG. 3.

The touch-sensing layers 534 may be formed substantially as illustrated above with respect to FIG. 4A or 4B. A touch-sensing layer 534 may be formed from flexible materials in order to better conform to the keycap, with substrate layers formed from flexible materials such as polyimide or polyethylene terephthalate. A flexible electrical connector 536 may be similarly formed from flexible material, which may be similar to the flexible substrate layers of the touch-sensing layer 534.

The flexible electrical connectors 536 include conductive material (e.g., an electrical connection), which may be formed as one or more wires, traces, or similar conducting paths. The flexible electrical connectors 536 may electrically connect the sense electrodes and drive electrodes of the touch-sensing layers 534 to form a larger array of sense electrodes and drive electrodes. The connections of the flexible electrical connectors 536 may thus create a set of virtual rows and columns of sense and drive electrodes across the keyboard to create a near-continuous touch input surface over the keys.

In some embodiments, the touch-sensing layers 534 and flexible electrical connectors 536 may be formed from the same materials. In these embodiments, the touch-sensing layers 534 and flexible electrical connectors 536 may be formed in the same process, and may further be formed as a single array covering an entire keyboard, or a sheet forming multiple keyboards which are later separated.

In addition to providing an electrical connection, the flexible electrical connector 536 material and its physical shape may also be formed in accordance with desired compliance and rigidity in order to improve the mechanical motion and feel of the keys. Example cross-sections of the flexible electrical connectors 536 are illustrated further below with respect to FIGS. 5B and 5C. Example shapes are illustrated below with respect to FIG. 6.

Figure 5B:
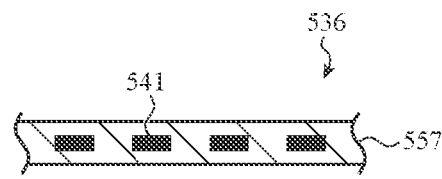
FIG. 5B depicts a cross-sectional view of a flexible electrical connector, taken along line B-B of FIG. 5A and according to a first embodiment.
Figure 5C:
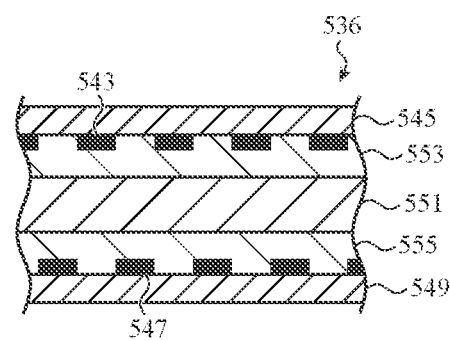
FIG. 5C depicts a cross-sectional view of a flexible electrical connector, taken along line B-B of FIG. 5A and according to another embodiment.

A flexible electrical connector 536 may include multiple layers as shown in FIGS. 5B and 5C. FIG. 5B depicts a cross-sectional view of a flexible electrical connector 536 according to a first embodiment. The flexible electrical connector 536 may include an array of conductors 541, formed as one or more wires, traces, or similar conducting paths, positioned within a flexible substrate 557. In some embodiments, the array of conductors 541 is disposed in a single layer, while in other embodiments the array of conductors 541 may be disposed in multiple layers. The conductors 541 may include materials such as, but not limited to: silver, copper, gold, constantan, karma, isoelastic, indium tin oxide, or any combination thereof. Each end of a conductor 541 may be bonded to or formed integral with conductors and/or sense electrodes in the touch-sensing layer on adjacent keys.

The conductors 541 may be disposed within a suitable flexible substrate 557 formed from polyimide, polyethylene terephthalate, plastic, or any combination thereof. In some embodiments, the flexible substrate 557 may be formed as a single substrate layer around the conductors 541. In other embodiments, the flexible substrate 557 may include multiple layers of flexible material, wherein the conductors 541 may be deposited on one or more of the layers. The material of the flexible substrate 557 may be selected according to a desired flexibility, and additionally or alternatively may be selected for compliance, rigidity, durability, cost, ease of manufacturing, and similar features.

The layers, their arrangements, and the materials described in FIG. 5B are examples. Additional or fewer layers may be implemented in other embodiments. The arrangement of the various layers and the materials used may also differ in other embodiments.

Figure 7A:
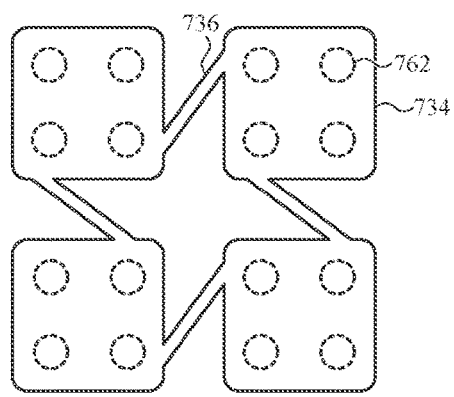
FIGS. 7A-D depict example arrays of touch-sensitive pixels within touch-sensing layers.
Figure 7B:
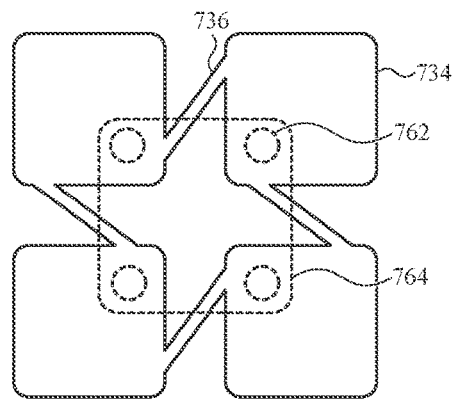
Figure 7C:
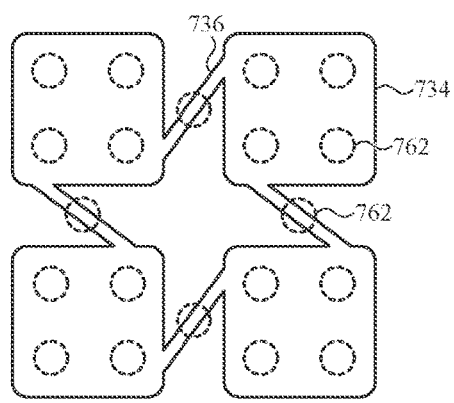
Figure 7D:
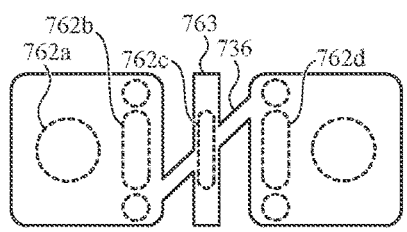

FIG. 5C depicts a cross-sectional view of a flexible electrical connector 536 according to another embodiment incorporating touch sensing (see FIGS. 7C and 7D). The flexible electrical connector 536 may include an array of electrodes 543, 547, which may also operate as sense electrodes. An array of conductors, operating as sense electrodes 543, is positioned near a top surface of the flexible electrical connector 536. The sense electrodes 543 may include materials such as, but not limited to: silver, copper, gold, constantan, karma, isoelastic, indium tin oxide, or any combination thereof. The sense electrodes 543 may be disposed on a first substrate layer 545. The first substrate layer 545 may be comprised of a number of suitable materials, such as, but not limited to: polyimide, polyethylene terephthalate, plastic, metal, ceramic, glass, or any combination thereof.

The sense electrodes 543 may be formed or deposited on the first substrate layer 545 using a suitable disposition technique such as, but not limited to: vapor deposition, sputtering, printing, roll-to-roll processing, gravure, pick and place, adhesive, mask-and-etch, and so on. If the keyboard includes transparent elements, it may be preferable for the sense electrodes 543 and first substrate layer 545 to be made from optically transparent materials, while optically opaque materials may be acceptable or preferable if the keyboard is opaque.

An array of drive electrodes 547 may be positioned on a layer below the sense electrodes 543. Similar to the sense electrodes 543, the drive electrodes 547 may include materials such as, but not limited to: silver, copper, gold, constantan, karma, isoelastic, indium tin oxide, or any combination thereof. The drive electrodes 547 may be comprised of the same material as the sense electrodes 543, or they may be comprised of distinct materials. The drive electrodes 547 may be disposed on a second substrate layer 549. The second substrate layer 549 may be comprised of a number of suitable materials (e.g., the same or a different material as the first substrate layer 545), such as, but not limited to: polyimide, polyethylene terephthalate, plastic, metal, ceramic, glass, or any combination thereof. Each end of a drive electrode 547 and each end of a sense electrode 543 may be bonded to or formed integral with conductors and/or sense electrodes in the touch-sensing layer on adjacent keys.

The drive electrodes 547 may be formed or deposited on the second substrate layer 549 using a suitable deposition technique (e.g., the same or a different technique as the sense electrodes 543) such as, but not limited to: vapor deposition, sputtering, printing, roll-to-roll processing, gravure, pick and place, adhesive, mask-and-etch, and so on. If the keyboard includes transparent elements, it may be preferable for the drive electrodes 547 and second substrate layer 549 to be made from optically transparent materials, while optically opaque materials may be acceptable or preferable if the keyboard is opaque.

The sense electrodes 543 and the drive electrodes 547 may be separated by an insulating layer 551. The insulating layer 551 may include materials such as, but not limited to: plastic, metal, ceramic, glass, polyimide, polyethylene terephthalate, or any combination thereof. The sense electrodes 543 and first substrate layer 545 may be bonded to the insulating layer 551 with an adhesive layer 553. The adhesive layer 553 may be any suitable material that promotes adhesion between the sense electrodes 543, the first substrate layer 545, and the insulating layer 551. According to some embodiments, the adhesive layer 553 can include a pressure sensitive adhesive.

The drive electrodes 547 and second substrate layer 549 may be similarly bonded to the insulating layer 551 with an adhesive layer 555. The adhesive layer 555 may be any suitable material that promotes adhesion between the drive electrodes 547, the second substrate layer 549, and the insulating layer 551. According to some embodiments, the adhesive layer 555 can include a pressure sensitive adhesive (e.g., the same or a different pressure sensitive adhesive used in adhesive layer 553).

The flexible electrical connector 536 may include capacitive sensing, and the sense electrodes 543 and drive electrodes 547 may have various dimensions and be arranged in various ways and patterns. For example, as depicted in FIG. 5B, the flexible electrical connector 536 includes at least two sense electrodes 543 electrically connected in pairs. One or more drive electrodes 547 are positioned in between the pairs of sense electrodes 543.

Additionally or alternatively, the sense electrodes 543 may be arranged in rows while the drive electrodes 547 are arranged in columns. In another arrangement, the sense electrodes 543 may be arranged in columns while the drive electrodes 547 are arranged in rows. In yet another embodiment, portions of the drive electrodes 547 may be interlocked with portions of the sense electrodes 543 to form an interdigitated pattern. In another example, the sense electrodes 543 may be arranged in a first plane and the drive electrodes 547 may be arranged on a second, different plane. In some embodiments, the dimensions of the drive electrodes 547 and sense electrodes 543 may vary. For example, the dimensions of the drive electrodes 547 and/or the sense electrodes 543 may have a first set of dimensions at a first portion near a keycap and may have a second set of dimensions at a second portion between a pair of keycaps.

In certain embodiments, the drive electrodes 547 may be omitted and/or replaced with one or more electrical grounds. In such embodiments, capacitances at the sense electrodes 543 may vary as a finger or other object approaches and/or touches the sense electrode(s) 543. This change in capacitance may be measured and used as input, in a fashion similar to the change in capacitance between sense electrodes 543 and drive electrodes 547.

The layers, their arrangements, and the materials described in FIG. 5C are examples. Additional or fewer layers may be implemented in other embodiments. The arrangement of the various layers and the materials used may also differ in other embodiments.

FIGS. 6A-6F depict example flexible electrical connectors 636a-636e disposed between pairs of touch-sensing layers 634. The flexible electrical connectors 636a-636e may be formed in a variety of shapes. Different shapes may offer varying advantages in terms of flexibility, compliance, rigidity, durability, cost, ease of manufacturing, and similar features. Example flexible electrical connectors 636a-636e are depicted, but these are for illustrative purposes and many other shapes and sizes of electrical connectors may be used.

Figure 6A:
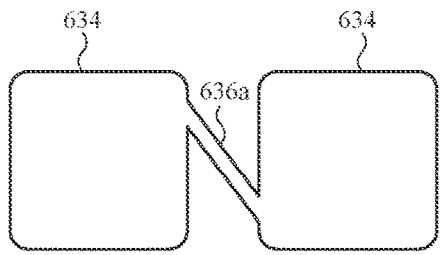
FIGS. 6A-6F depict example flexible electrical connectors disposed between pairs of touch-sensing layers.
Figure 6B:
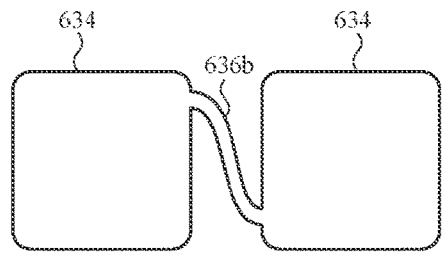
Figure 6C:
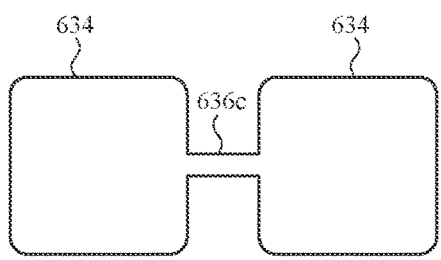
Figure 6D:
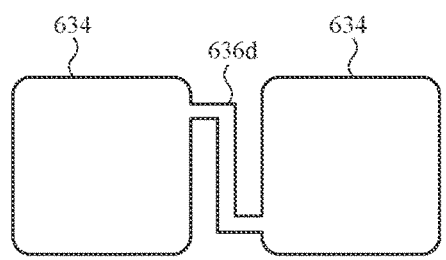
Figure 6E:
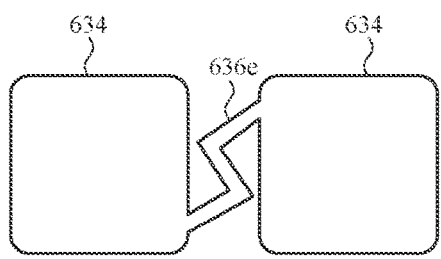
Figure 6F:
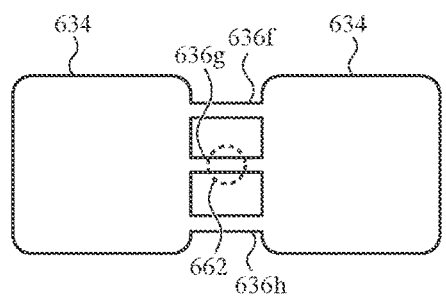

As depicted in FIG. 6F, in some embodiments multiple flexible electrical connectors 636f, 636g, 636h may span between (and connect) adjacent keys. In some examples, rows of touch-sensing pixels within adjacent touch-sensing layers 634 may be separately connected by flexible electrical connectors 636f, 636g, 636h. In other embodiments, two or more flexible electrical connectors 636f, 636g, 636h may offer advantages in terms of flexibility, compliance, rigidity, and similar features, and only one flexible electrical connector 636f may electrically connect the touch-sensing layers 634. In still other examples, one or more of the multiple flexible electrical connectors 636g may define or include a touch-sensitive pixel or partial touch-sensing pixel 662 (see FIGS. 7C and 7D).

The touch-sensing layers 734 may be formed in a manner to create touch-sensitive pixels 762 where a touch may be detected and its location determined, as illustrated in FIGS. 7A-D. For example, in a mutually-capacitive touch-sensing layer 734, the touch-sensitive pixels 762 may correspond to intersection points of rows and columns of sense electrodes and drive electrodes.

FIG. 7A depicts an example array of touch-sensitive pixels 762 within touch-sensing layers 734 interconnected by flexible electrical connectors 736. Each touch-sensing layer 734 may correspond to a key on a keyboard, and may consist of multiple touch-sensitive pixels 762. While the touch-sensitive pixels 762 are illustrated having the same size and spacing, with four disposed within each touch-sensing layer 734, other embodiments may employ different sizes, arrangements, and numbers of touch-sensitive pixels 762.

FIG. 7B depicts another example array of touch-sensitive pixels 762 within touch-sensing layers 734 interconnected by flexible electrical connectors 736. As depicted in FIG. 7B, the touch-sensitive pixels 762 may be arranged such that each touch-sensing layer 734 has a touch-sensitive pixel (or partial touch-sensitive pixel) near the corner. This may allow for a processing device or other touch-sensing circuitry to create a virtual super-pixel 764 using inputs from adjoining corner touch-sensitive pixels 762. This may allow for the multi-function input device to correct for any lack of touch-sensitive pixels 762 between keys. Further, information from multiple pixels (such as adjacent pixels) may be used to estimate or otherwise determine a location of a touch between pixels, or that overlaps multiple pixels. Changes in capacitances of neighboring pixels may indicate that a touch has occurred between the pixels, or on both pixels, for example. In some embodiments, the touch-sensitive pixels 762 may be arranged differently. For example, one or more large touch-sensitive pixels 762 may be positioned in a central portion of a key, and small or partial touch-sensitive pixels 762 may be positioned at corners and/or edges of a key in order to create virtual pixels across two or more keys.

Additionally or alternatively, touch-sensitive pixels (or partial touch-sensitive pixels) 762 may be disposed within the flexible electrical connectors 736. FIG. 7C depicts another example array of touch-sensitive pixels 762 within touch-sensing layers 734 and interconnecting flexible electrical connectors 736. As depicted in FIG. 7C, the touch-sensitive pixels 762 may be arranged such that touch-sensitive pixels 762 are positioned within both the touch-sensing layers 734 and each flexible electrical connector 736. This may also allow for a more continuous input surface and correct for any lack of touch-sensitive pixels 762 between keys.

FIG. 7D depicts another example array of touch-sensitive pixels 762a, 762b, 762c, 762d within touch-sensing layers 734 and interconnecting flexible electrical connectors 736. As depicted in FIG. 7D, the touch-sensing layer 734 over each key may include at least one touch-sensitive pixel 762a and multiple partial touch-sensitive pixels 762b, 762d. The partial touch-sensitive pixels 762b, 762d of adjacent keys may form virtual pixels across the keys. For example, a first partial touch-sensitive pixel 762b at an edge of a first key may be paired with a second partial touch-sensitive pixel 762*d* to form a touch-sensitive pixel or virtual touch-sensitive pixel.

In some embodiments, a flexible electrical connector 736 may include a touch-sensitive portion 763, wherein a third partial touch-sensitive pixel 762*c* may be formed. In these embodiments, the first partial touch-sensitive pixel 762*b*, the second partial touch-sensitive pixel 762*d*, and the third partial touch-sensitive pixel 762*c* may together form a touch-sensitive pixel or virtual touch-sensitive pixel.

It should be understood that the example touch-sensitive pixels and partial touch-sensitive pixels depicted in FIGS. 7A-7D are illustrative in nature. The size, arrangement, number, location, and so on of the touch-sensitive pixels and partial touch sensitive pixels may vary in other embodiments.

Figure 8:
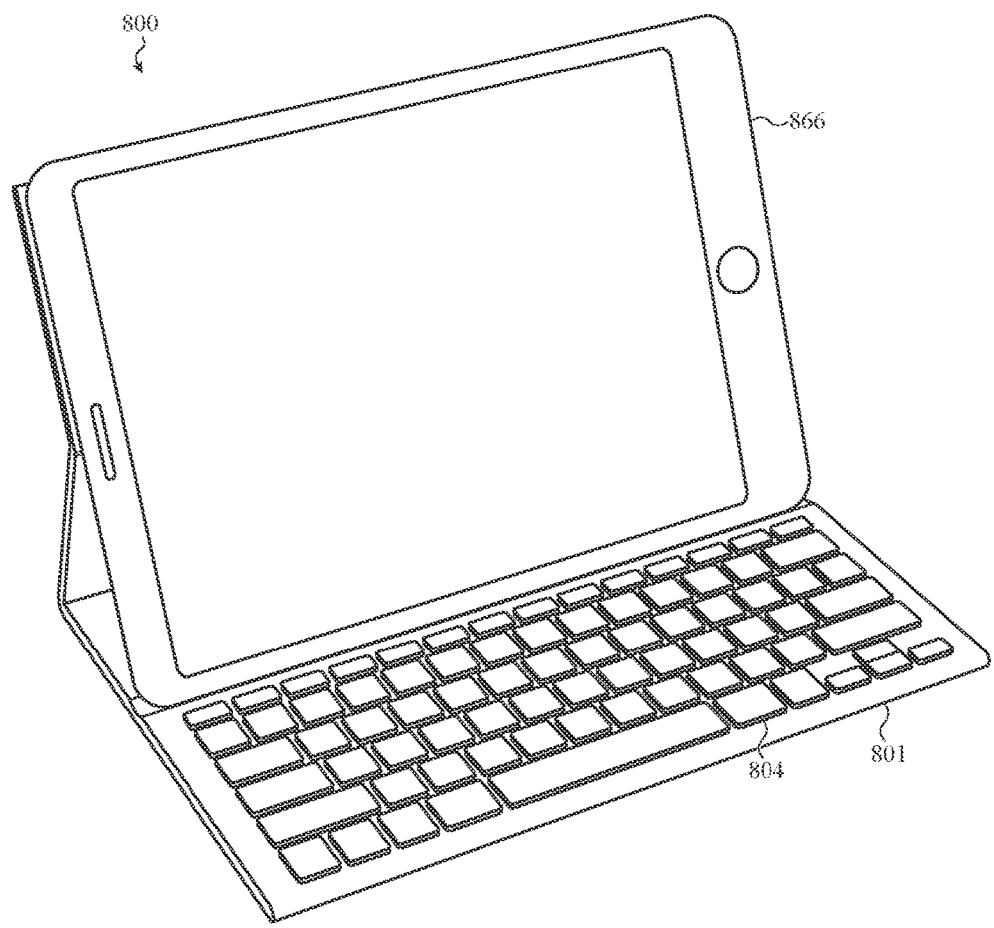
FIG. 8 depicts an example multifunction input device, incorporated into a cover case.
Figure 9:
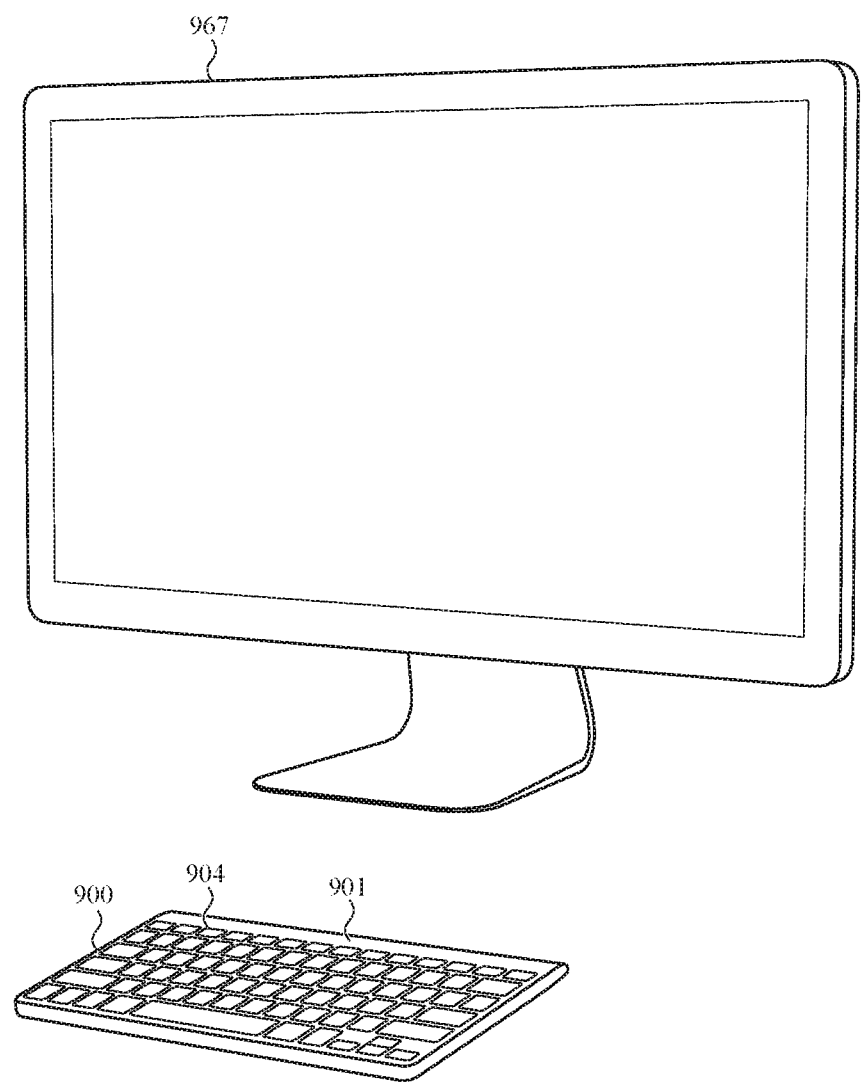
FIG. 9 depicts an example multifunction input device in communication with a desktop computer.

As illustrated in FIGS. 8 and 9, a multifunction input device according to the present invention may be implemented in many forms. A multifunction input device according to the present invention may take the form of a keyboard, mouse, trackpad, or other input device. An input device may be incorporated into devices such as a laptop computer, as shown above with respect to FIGS. 1A-1C, or it may be a separate device in communication with a host computer or other device as illustrated in FIG. 9. The multifunction input device of the present invention may also be incorporated into separate multipurpose devices or accessories, such as a case for a portable electronic device as illustrated with respect to FIG. 8.

FIG. 8 depicts an example multifunction input device 800, incorporated into a cover case. The cover case may have an enclosure 801 and be attached to and in communication with a portable tablet computing device 866. The multifunction input device 800 may be in communication with the tablet 866 through a wired connection, an electrical contact connection, or a wireless connection. The enclosure 801 of the multifunction input device 800 includes an array of keys 804, which may include the touch-sensing layer described above with respect to FIGS. 1A-7D.

FIG. 9 depicts an example multifunction input device 900 in communication with a desktop computer 967. The input device 900 may be in communication with the desktop 967 through a wired or wireless connection. The multifunction input device 900 may be implemented as a stand-alone keyboard having an enclosure 901 housing an array of keys 904. The keys 904 may include the touch-sensing layer described above with respect to FIGS. 1A-7D.

The example devices illustrated in the above figures are intended to be illustrative in nature, and can be implemented in a number of other manners. Further, while the above examples are illustrated with keys within a keyboard, they may be implemented in other input devices with movable input components configured to receive both touch and mechanical inputs.

Figure 10:
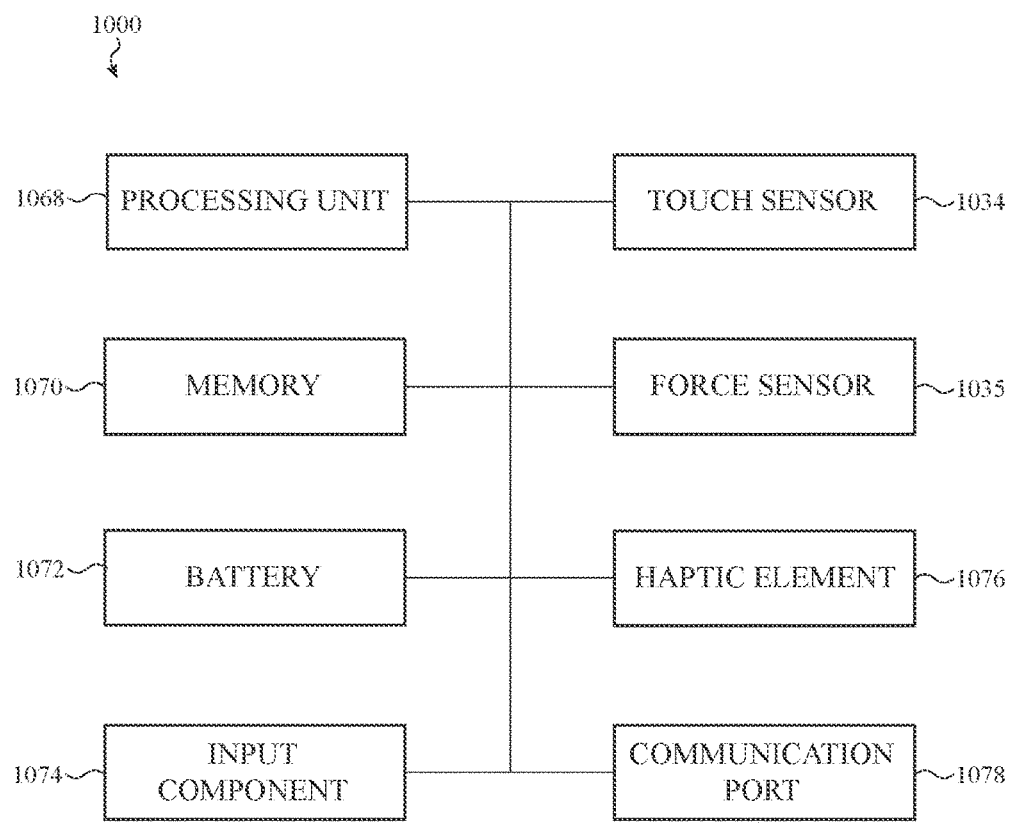
FIG. 10 depicts example components of a multifunction input device in accordance with the embodiments described herein.

FIG. 10 depicts example components of a multifunction input device in accordance with the embodiments described herein. The schematic representation depicted in FIG. 10 may correspond to components of the devices depicted in FIGS. 1A-9, described above. However, FIG. 10 may also more generally represent other types of devices with movable input components having both touch-sensitive input mechanisms (such as capacitive sensors) and mechanical input mechanisms (such as collapsible dome switches).

As shown in FIG. 10, a device 1000 includes a processing unit 1068 operatively connected to computer memory 1070. The processing unit 1068 may be operatively connected to the memory 1070 component via an electronic bus or bridge.

The processing unit 1068 may include one or more computer processors or microcontrollers that are configured to perform operations in response to computer-readable instructions. Where incorporated into a larger device such as a laptop computer, the processing unit 1068 may be the central processing unit (CPU) of the larger device. Additionally or alternatively, the processing unit 1068 may include other processors within the device 1000 including application specific integrated chips (ASIC) and other microcontroller devices. The processing unit 1068 may be configured to perform functionality described in the examples above.

The memory 1070 may include a variety of types of non-transitory computer-readable storage media, including, for example, read access memory (RAM), read-only memory (ROM), erasable programmable memory (e.g., EPROM and EEPROM), or flash memory. The memory 1070 is configured to store computer-readable instructions, sensor values, and other persistent software elements.

In this example, the processing unit 1068 is operable to read computer-readable instructions stored on the memory 1070. The computer-readable instructions may adapt the processing unit 1068 to perform the operations or functions described above with respect to FIGS. 1-11. The computer-readable instructions may be provided as a computer-program product, software application, or the like.

The device 1000 may also include a battery 1072 that is configured to provide electrical power to the components of the device 1000. The battery 1072 may include one or more power storage cells that are linked together to provide an internal supply of electrical power. The battery 1072 may be operatively coupled to power management circuitry that is configured to provide appropriate voltage and power levels for individual components or groups of components within the device 1000. The battery 1072, via power management circuitry, may be configured to receive power from an external source, such as an AC power outlet. The battery 1072 may store received power so that the device 1000 may operate without connection to an external power source for an extended period of time, which may range from several hours to several days.

In some embodiments, the device 1000 includes one or more input components 1074. The input component 1074 is a device that is configured to receive user input. The input component 1074 may include, for example, a push button, a touch-activated button, or the like. In some embodiments, the input components 1074 may provide a dedicated or primary function, including, for example, a power button, volume buttons, home buttons, scroll wheels, and camera buttons. Generally, a touch sensor and a force sensor may also be classified as input components. However, for purposes of this illustrative example, the touch sensor 1034 and force sensor 1035 are depicted as distinct components within the device 1000.

The device 1000 may also include a touch sensor 1034 that is configured to determine a location of a finger or touch over one or more keys or other input surface of the device 1000. The touch sensor 1034 may be implemented in a touch-sensing layer, and may include a capacitive array of electrodes or nodes that operate in accordance with a mutual-capacitance or self-capacitance scheme.

The device 1000 may also include a force sensor 1035 in accordance with the embodiments described herein. As previously described, the force sensor 1035 may be configured to receive force touch input over one or more keys or other input surface of the device 1000. The force sensor 1035 may also be implemented in a touch-sensing layer, and may include one or more force-sensitive structures that are responsive to a force or pressure applied to an external surface of the device. In accordance with the embodiments described herein, the force sensor 1035 may be configured to operate using a dynamic or adjustable force threshold. The dynamic or adjustable force threshold may be implemented using the processing unit 1068 and/or circuitry associated with or dedicated to the operation of the force sensor 1035.

The device 1000 may also include a haptic element 1076. The haptic element may be implemented with a number of devices and technologies, such as an electromechanical actuator. The haptic element 1076 may be controlled by the processing unit 1068, and may be configured to provide haptic feedback to a user interacting with the device 1000.

The device 1000 may also include a communication port 1078 that is configured to transmit and/or receive signals or electrical communication from an external or separate device. The communication port 1078 may be configured to couple to an external device via a cable, adaptor, or other type of electrical connector. In some embodiments, the communication port 1078 may be used to couple the device 1000 to a host computer.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. A touch-sensitive keyboard, comprising:
   a frame;
   a base plate;
   an array of keys positioned at least partially within the frame, each key comprising:
      a keycap;
      a support mechanism connected to the keycap and the base plate and configured to bias the keycap upward in an absence of an exerted force; and
      a touch-sensing layer attached to and positioned above the keycap, wherein the array of keys comprises a plurality of flexible electrical connectors, wherein each flexible electrical connector connects the touch-sensing layers of a respective pair of adjacent keys, and wherein each flexible electrical connector has a length that is longer than a distance that separates the respective pair of adjacent keys.

2. The touch-sensitive keyboard of claim 1, wherein each flexible electrical connector is configured to deform when one of the respective pair of adjacent keys is depressed.

3. The touch-sensitive keyboard of claim 2, wherein the flexible electrical connector is a flexible printed circuit board.

4. The touch-sensitive keyboard of claim 1, further comprising touch-sensing circuitry connected to the touch-sensing layer and configured to detect a location of a touch on the array of keys.

5. The touch-sensitive keyboard of claim 1, wherein the touch-sensing layer for each key comprises at least two touch-sensitive pixels.

6. The touch-sensitive keyboard of claim 1, wherein the touch-sensing layer on each key comprises at least a first touch-sensitive pixel and at least a portion of a second touch-sensitive pixel.

7. The touch-sensitive keyboard of claim 1, wherein the touch-sensing layer of each key further comprises a compliant element and is configured to detect an amount of force applied to a surface of the array of keys.

8. The touch-sensitive keyboard of claim 7, wherein the compliant element comprises at least one of a flexible silicone gel, a compliant foam, or an air gap.

9. The touch-sensitive keyboard of claim 1, wherein each touch-sensing layer and each flexible electrical connector each comprise at least one of a polyimide substrate or a polyethylene terephthalate substrate.

10. An input device, comprising:
    a first key comprising:
       a first collapsible dome;
       a first keycap disposed over the first collapsible dome; and
       a first touch-sensing layer disposed above the first keycap;
    a second key comprising:
       a second collapsible dome;
       a second keycap disposed over the second collapsible dome, wherein there is a gap between the first and second keycaps; and
       a second touch-sensing layer disposed above the second keycap; and
       a flexible electrical connector that extends across the gap from the first touch-sensing layer to the second touch-sensing layer.

11. The input device of claim 10, wherein the first key is configured to:
    generate a first output from the first collapsible dome; and
    generate a second output from the first touch-sensing layer.

12. The input device of claim 11, wherein an insulating layer is positioned over the first touch-sensing layer and forms an outer surface of the first key.

13. The input device of claim 11, wherein:
    the flexible electrical connector deforms as the first key moves.

14. The input device defined in claim 10, wherein the flexible electrical connector has a length and a width that is smaller than the length, wherein the flexible electrical connector extends along the length between the first and second touch-sensing layers, and wherein the length of the flexible electrical connector is longer than a distance between the first and second touch-sensing layers.

15. The input device defined in claim 10, further comprising:
    a frame in the gap between the first and second keycaps;
    an insulating layer that has a first portion formed over the first touch-sensing layer, a second portion formed over the second touch-sensing layer, and a third portion formed between the first and second portions that is formed over the flexible electrical connector and the frame, wherein the flexible electrical connector is interposed between the frame and the insulating layer and wherein the flexible electrical connector is not coupled to the third portion of the insulating layer.

16. An input device comprising:
    a frame; and
    a key within the frame, comprising:
       an insulating layer;
       a touch-sensing layer beneath the insulating layer;

a keycap beneath the touch-sensing layer;
a collapsible dome beneath the keycap;
a contact beneath the collapsible dome; and
a flexible electrical connector extending, at a non-right angle, from the touch-sensing layer and positioned beneath the insulating layer; wherein the insulating layer is affixed to the touch-sensing layer; and the insulating layer is not affixed to the flexible electrical connector.

17. The input device of claim 16, wherein:

the contact generates a first input signal when the collapsible dome collapses; and the touch-sensing layer generates a second input signal in response to a touch.

18. The input device of claim 16, wherein the insulating layer is formed from at least one of fabric, silicone, polyester, or nitrile.

19. The input device of claim 16, wherein the touch-sensing layer comprises at least two touch-sensitive pixels on the keycap.

20. The input device of claim 16, wherein the touch-sensing layer comprises at least a first touch-sensitive pixel and at least a portion of a second touch-sensitive pixel on the key.

* * * * *